United States Patent [19]
Gupta

[11] Patent Number: 4,775,730
[45] Date of Patent: Oct. 4, 1988

[54] COPOLYMERS OF P-ACETOXYSTYRENE WITH ANY OF CERTAIN POLYUNSATURATED COMPOUNDS

[75] Inventor: Balaram B. G. Gupta, N. Plainfield, N.J.

[73] Assignee: Hoechst Celanese Corporation, Summerville, N.J.

[21] Appl. No.: 29,108

[22] Filed: Mar. 23, 1987

[51] Int. Cl.$^4$ .............. C08F 18/16; G03C 1/495; G03C 1/68; G03C 5/00
[52] U.S. Cl. .................. 526/326; 526/340; 526/295; 430/270; 430/287; 430/325
[58] Field of Search .............. 526/326, 340, 295; 430/270, 325, 287

[56] References Cited

U.S. PATENT DOCUMENTS

| | | | |
|---|---|---|---|
| 2,980,658 | 4/1961 | Haw | 526/326 |
| 4,096,009 | 6/1978 | Toshida | 428/250 |
| 4,211,824 | 7/1986 | Toshida | 428/463 |
| 4,283,511 | 8/1981 | Uens et al. | 524/800 |
| 4,433,015 | 2/1984 | Lindert | 427/388.4 |
| 4,480,034 | 10/1984 | Hsieh | 435/136 |
| 4,522,999 | 6/1988 | Heimberg | 524/564 |
| 4,535,059 | 8/1985 | Hsieh et al. | 435/142 |

FOREIGN PATENT DOCUMENTS

| | | | |
|---|---|---|---|
| 603164 | 8/1960 | Canada | 526/326 |
| 58-210914 | 12/1983 | Japan | 526/326 |

Primary Examiner—Joseph L. Schofer
Assistant Examiner—N. Sarofim
Attorney, Agent, or Firm—Marvin Turken

[57] ABSTRACT

A new class of resins is provided which are copolymers of monomers comprising p-acetoxystyrene and any of certain designated polyunsaturated comonomers, viz., (1) a polyunsaturated carboxylic acid such as an alkyl ester of a carboxylic acid containing a conjugated diene group, e.g., a dialkyl muconate or an alkyl sorbate, or an allyl ester of a monoethylenically unsaturated carboxylic acid, e.g., diallyl maleate; (2) a conjugated diene hydrocarbon such as 2,5-dimethyl-2,4-hexadiene; or (3) a halogen-substituted conjugated diene hydrocarbon. One or more additional monoethylenically or polyethylenically unsaturated monomers, e.g. styrene, may be used in the preparation of the copolymer. The preferred copolymers are of p-acetoxystyrene and dimethyl muconate or diethyl muconate. The copolymer may be selectively hydrolyzed to corresponding copolymers of p-vinylphenol.

16 Claims, No Drawings

COPOLYMERS OF P-ACETOXYSTYRENE WITH ANY OF CERTAIN POLYUNSATURATED COMPOUNDS

BACKGROUND OF THE INVENTION

This invention relates to new copolymers of p-acetoxystyrene and certain polyunsaturated carboxylic esters.

Various copolymers of p-acetoxystyrene and other polymerizable monomers are known in the art and have miscellaneous end uses. For example, Japanese Kokai Nos. 77 35779, published Mar. 18, 1977, and 77 58087, published May 13, 1977, disclose copolymers of p-acetoxystyrene and divinylbenzene which are hydrolyzed, treated with paraformaldehyde and dimethyl amine or pyrrolidine, and quaternized with methyl bromide or dimethyl sulfate to obtain anion exchange resins. Japanese Kokai No. 77-35,189, published Mar. 17, 1977, teaches the sulfonation of copolymers of p-acetoxystyrene and a polyene compound such as divinylbenzene to obtain microporous cation exchange resins. Arshady et al, "Phenolic Resins for Solid-Phase Peptide Synthesis: Copolymerization of Styrene and p-acetoxystyrene", J. Polymer Science: Polymer Chemistry Edition, Vol. 12, 2017–2025 (1974), show copolymers of styrene, p-acetoxystyrene, and divinyl benzene used to produce cross-linked resins for solid phase peptide synthesis.

In addition to the foregoing, the prior art also shows different polymers of p-vinylphenol for various applications. Thus, Japanese Patent Publication No. 34902/1978 teaches compositions comprising a polymer having more than 20 mol % of p-hydroxystyrene (i.e., p-vinylphenol) and an aromatic azide compound, which are useful for photoresist, relief printing plate, and offset printing plate applications. German Offenlegungschrift DE No. 3,311,129, published Apr. 7, 1982, shows corrosion-resistant waterborne coatings useful on phosphated metals based on solutions of aminomethylated poly(-vinylphenols) prepared by reacting poly(4-vinylphenol) with formaldehyde and methylhydroxyethyl amine. Furuya (Res. Inst. Polym. Text., Yatabe, Japan) Kenkyu Hokuku - Sen'i Kobunshi Zairyo Kenkyusho 1981, (129), 13–16 (Japan), abstracted in Chemical Abstracts 95:2205-45h, shows the reaction of poly (p-vinylphenol) and diazotized 3- or 4-substituted aniline to obtain polymers which produce complexes with copper. Such polymers would thus appear to be useful as metal chelating agents.

Copolymers of dialkyl muconates and polymerizable comonomers are also known in the art. Thus, Bando et al, Journal of Polymer Science, Polymer Chemistry Edition, Vol. 15, 1917–1926, (1977), disclose copolymers of diethyl muconate with styrene, acrylonitrile or 2-vinylpyridine.

SUMMARY OF THE INVENTION

In accordance with this invention, a new class of resins is provided which are copolymers of p-acetoxystyrene with any of certain designated polyunsaturated compounds, viz., (1) a polyunsaturated carboxylic ester, such as an alkyl ester of a carboxylic acid containing a conjugated diene group, e.g., a dialkyl ester of a dicarboxylic acid containing a conjugated diene group, such as muconic acid, or an alkyl ester of a monocarboxylic acid containing a conjugated diene group; such as sorbic acid; or an allyl ester of a monoethylenically unsaturated carboxylic acid, e.g., maleic acid, acrylic and or methacrylic acid; (2) a conjugated diene hydrocarbon; or (3) a halogen-substituted conjugated diene hydrocarbon.

The alkyl groups of the foregoing alkyl esters or any alkyl substituents on the basic skeletal straight chain of any of the foregoing comonomers preferably contain 1 to 4 carbons. The contemplated halogen-substituted conjugated diene hydrocarbons preferably contain 1 to 4 halogen atoms, which may be chloride, fluoride, bromide, or iodide. The molecules of any of the contemplated comonomers preferably contain no more than 16 carbon atoms, and most preferably 6 to 16 carbon atoms.

The contemplated dialkyl esters of dicarboxylic acids containing a conjugated diene group include, for example, dialkyl muconates, dialkyl 2,5-dialkyl muconates, and dialkyl 2-alkyl muconates. The contemplated alkyl esters of monocarboxylic acids containing a conjugated diene group include, for example, alkyl sorbates such as methyl sorbate or ethyl sorbate. The contemplated allyl esters of monoethylenically unsaturated carboxylic acids include, for example, diallyl maleate, diallyl fumarate diallyl itaconate, allyl acrylate and allyl methacrylate. The contemplated conjugated diene hydrocarbons or halogen-substituted conjugated diene hydrocarbons include, for example, 2,5-dimethyl-2,4-hexadiene, 2,4-hexadiene and 2-chloro-2,4-hexadiene.

In addition to p-acetoxystyrene and the designated polyunsaturated monomer, one or more additional monomers may be present in the polymerizable mixture used to prepare the polymers of this invention. Such additional monomers may be, for example, a monoethylenically unsaturated compound such as vinyl aromatic compounds, e.g., styrene, alkyl acrylates and methacrylates wherein the alkyl group contains from 1 to 12 carbon atoms, mono-and polyalkoxyalkylacrylates and methacrylates wherein the alkoxy groups and alkyl groups contain from 1 to 4 carbon atoms and wherein the molecules contain from 1 to 20 alkoxy groups, hydroxyalkyl acrylates and methacrylates wherein the alkyl group contains from 1 to 6 carbon atoms, acrylonitrile, methacrylonitrile, vinyl halides such as vinyl chloride, vinyl pyrrolidone, vinyl pyridine, vinyl carbazole and the like.

One or more other polyunsaturated monomers in addition to the necessary polyunsaturated carboxylic ester may also be used in preparing the polymers of this invention. In general, these monomers are compounds which contain two or more ethylenically unsaturated groups and preferably, two to about six ethylenic groups. The ethylenically unsaturated groups are acrylate and methacrylate groups, vinyl groups and allyl groups. Compounds which contain the acrylic or methacrylic groups are acrylic or methacrylic acid esters of polyols wherein the polyols have two or more hydroxyl groups per molecule. Examples of such compounds are the diacrylic or methacrylic acid esters of ethylene glycol, propylene glycol, butanediol, hexanediol, polyoxyethylene glycols, di and triacrylic or methylacrylic acid esters of glycerine and hexanetriol, trimethylolpropane, trimethylolethane, di, tri and tetra acrylic acid or methaacrylic acid esters of pentaerythritol, the di, tri, tetra, penta and hexa acrylic or methyacrylic acid esters of dipentaerythritol and the like. Other polyacrylates or methacrylates are the acrylated and methacrylated epoxy compounds such as the acrylated or methacrylated glycidyl ethers of dihydric phenols, acrylated and methacrylated epoxidized vegetable oils, acrylated and methacrylated urethanes and acrylated and methacrylated polyesters.

Examples of polyvinyl and polyallyl compounds are divinylbenzene, divinyltoluene, diallylbenzene, diallytoluene, diallyl terephthalate, and the like.

The copolymers of this invention may be suitably prepared by the free radical polymerization of the designated polyunsaturated comonomer, e.g., dialkyl muconate, and p-acetoxystyrene, in solution, emulsion, or suspension, using well known polymerization techniques. A free radical type of polymerization initiator or "catalyst" is generally employed which is preferably an azo compound such as 2,2'-azobis(2,4-dimethylvaleronitrile) (sold by du Pont as "VAZO-52"), 2,2'-azobis(methylbutyronitrile), (sold by du Pont as "VAZO-67") and 1,1'-azobis(cyanocyclohexane) (sold by du Pont as "VAZO-88"). Other free-radical polymerization initiators which may be used are peroxy compounds, e.g., benzoyl peroxide and potassium persulfate, and peresters and peroxyketals sold by Pennwalt under the trademark "Lupersols".

The copolymers of the invention will generally contain about 10 to about 90 weight percent of the designated polyunsaturated comonomer and about 10 to about 90 weight percent of the p-acetoxystyrene monomer. If one or more monounsaturated or polyunsaturated monomers are used in addition to the p-acetoxystyrene and designated polyunsaturated comonomer critical to the invention, they may be present in an amount of about 0 to 50, preferably about 0 to 20 percent by weight of the total monomeric mixture. However, the preferred copolymers are those made from dimethyl or diethyl muconate and p-acetoxystyrene using about 10 to about 55 weight percent dialkyl muconate and about 45 to about 90 weight percent p-acetoxystyrene.

The copolymers of this invention have various applications. Thus, the copolymers may be blended with any of various radiation polymerizable polyunsaturated compounds, e.g., polyol acrylates or methacrylates, and optionally a monounsaturated radiation polymerizable compound, e.g., ethoxyethyl acrylate to form radiation curable coating compositions. The copolymers can also be used in the preparation of negative acting photoresists, e.g. by dissolving the copolymer in an organic solvent such as a mixture of xylene and butyl acetate with a compound serving to cross-link the copolymer when exposed to suitable radiation, e.g., 2,6-bis(4-azidylbenzylidene)-4-methyl cyclohexanone (bis-azide). Such a composition may be coated onto a surface subjected to suitable UV radiation to cross-link the copolymer while in contact with an appropriate photomask and the surface developed by dissolving the uncrosslinked polymer in a solvent to obtain a pattern of exposed surface of fairly high resolution.

Since the copolymers of this invention possess polar functional groups such as acetoxy, ester and an olefinic group in the backbone, they can be grafted readily onto several other polymers for impact modified properties. For example, the copolymers can be grafted onto ethylene-propylene-diene monomer rubbers by vulcanization to obtain a polymer with improved impact properties and adhesion properties. Similarly the copolymers can be grafted onto acetal polymers for impact modified properties. The copolymer may also be sulfonated as disclosed in previously cited Japanese Kokai No. 77 35,189 to obtain microporous cation exchange resins.

The copolymers of this invention may also be selectively hydrolyzed to produce the corresponding p-vinyl phenol copolymers with little or no hydrolysis of the ester groups of the polyunsaturated carboxylic ester moieties, which may be present, e.g., by refluxing a 5 wt. % solution of the copolymer in 20% aqueous tetramethyl ammonium hydroxide for about one hour. The hydrolyzed copolymer may then be used in photoresist relief printing plate and offset printing plate applications as disclosed in previously cited Japanese Patent Publication No. 34,902/1977; in the production of anion-exchange resins as shown in previously cited Japanese Kokai Nos. 77 35779 and 77 58087; in the production of waterborne coatings for phosphated metals as disclosed in previously cited German Offenlegungschrift DE No. 3,311,129; and in the production of metal chelating agents as taught in the previously cited Furuya article.

The p-vinylphenol copolymers resulting from selective hydrolysis can also be converted to cationic polymers by reaction of the free phenolic groups with oxazolines and subsequent hydrolysis or to anionic polymers by reaction with cyclic sulfonates. These polymers can be used as cation or anion exchange resins or to prepare membranes for separation applications.

The dialkyl muconates which may be used in preparing the copolymers utilized in this invention are diesters of muconic acid. Muconic acid can be made by the microbiological oxidation of various hydrocarbon sustrates, as described in U.S. Pat. Nos. 4,480,034 and 4,535,059. The dialkyl muconates used in this invention may contain 1 to 4 carbon atoms in each alkyl group and are made by the direct esterification of muconic acid with methanol, ehtanol, propanol, isopropanol or the butanols.

DESCRIPTION OF SPECIFIC EMBODIMENT

The following examples further illustrate the invention. In each example, a free radical solution polymerization was carried out in a three neck flask equipped with mechanical stirrer, reflux condenser assembly, and under continuous purge of argon.

EXAMPLE 1

A mixture of para-acetoxystyrene (ASM; 90 ml, 0.65 mole), high purity toluene (90 ml) and VAZO-52 (1.26g) was degassed by three freeze-pump-thaw cycles. To this mixture was added recrystallized dimethyl muconate (MMu; 18.0 g, 0.106 mole) at once with thorough stirring. The mixture was then heated to 70°-80° C. under argon with stirring for 20 hours, during which time all the solids went into solution to give a white transparent syrupy mass. The syrup was dissolved in 500 ml acetone and suction filtered to remove any insoluble impurities. The clear polymer solution was then coagulated with methanol (14.0 liters), and acidified with dil. HCl (10 ml) to obtain a white granular polymer. Filtration and drying afforded 111.6 g of white powdered polymer. The degree of conversion was 91%. Based on an elemental analysis and a proton NMR analysis, the composition of the polymer was found to be ASM:MMu=80:20 molar ratio. The weight percents of elements were found to be: C=70.245, H=6.67 and calculated C=70.4, H=6.155. The polymer obtained by this procedure was also of high purity with levels of impurities as follows: S<2 ppm; P<7 ppm; Cl<40 pmm; Br<30 ppm; I<10 ppm; Mg<2 ppm; Cu<1 ppm; Fe<20 ppm; Na<15 ppm; K<1 ppm; and Li<1 ppm. The polymer was quite readily soluble in chloroform, tetrahydrofuran, dichloromethane, and acetone, but insoluble in xylene, toluene, methanol and hexane. The glass transition temperature of the polymer was found to be 106.5° C. The thermal decomposition onset of the polymer was determined to be 260° C. in nitrogen atmosphere. The weight average molecular weight $M_w$ and the number average molecular weight $M_n$ were respectively 57,650 and 33,300, thus having a very narrow polydispersity of 1.7. The molecular weight measurements were made by gel permeation chromatography (GPC). The infrared spectrum showed clearly two carbonyl absorptions at 1765 and 1730 cm$^{-1}$ corresponding to the acetoxy and muconate carbonyls of the polymer repeat units. This also clearly demonstrates that the polymerization of muconate takes place only through trans-1,4 additions. The copolymer also had very strong UV absorptions at 271.2, 264.4, and 247.2 nm.

with levels of impurities as follows: S<3 ppm; P<8 ppm; Cl<40 ppm; Br<20 ppm; I<10 ppm. The glass transition temperature $(T_g)$ was found to be 105° C. and the thermal decomposition onset in nitrogen atmosphere is at 300° C. The GPC analysis revealed $M_w$ and $M_n$ to be 24,650 and 14,650 respectively, thus giving a polydispersity $(M_w/M_n)$ of 1.7. The IR and UV spectra were same as in Example 1.

EXAMPLES 3 to 9

These examples illustrate copolymers of ASM and MMu containing various different compositons of the monomers. In all these runs the same procedure was used as described in Example 1 except for different amounts of the starting materials as shown in the Table, wherein $M_w$ is weight average molecular weight; $M_n$ is number average molecular weight; $M_w/M_n$ is molecular weight distribution or polydispersity; and n.d. is "not determined." In Example 4, 3.6 g of unreacted MMu was recovered.

TABLE

| Example | Reaction Components | Yield (g) | % Conv. | Composition ASM:MMu (Molar ratio) | Glass Transition Temperature $(T_g)$ | $M_w$ | $M_n$ | $M_w/M_n$ | Intrinsic Viscosity |
|---|---|---|---|---|---|---|---|---|---|
| 3 | ASM (10 ml) VAZO-52 (0.14 g) MMu (10 g) Toluene (30 ml) | 10.8 | 50.0 | 45:55 | 103° C. | 38,400 | 24,250 | 1.6 | n.d. |
| 4 | ASM (10 ml) VAZO-52 (0.14 g) MMu (10 g) Toluene (20 ml) | 10.7 | 59.0 | 60:40 | 88° C. | 41,350 | 24,700 | 1.7 | 0.25 |
| 5 | ASM (10 ml) VAZO-52 (0.14 g) Mmu (2.0 g) Toluene (20 ml) | 7.2 | 53.0 | 70:30 | n.d. | n.d. | n.d. | n.d. | n.d. |
| 6 | ASM (10 ml) VAZO-52 (0.14 g) MMu (3.0 g) Toluene (10 ml) | 10.4 | 70.0 | 70:30 | n.d. | 39,650 | 24,050 | 1.7 | 0.23 |
| 7 | ASM (10 ml) VAZO-52 (0.14 g) MMu (2.0 g) Toluene (10 ml) | 6.4 | 47.0 | 75:25 | n.d. | n.d. | n.d. | n.d. | n.d. |
| 8 | ASM (30 ml) VAZO-52 (0.42 g) MMu (6.0 g) Toluene (30 ml) | 33.1 | 81.0 | 80:20 | n.d. | 84,300 | 50,650 | 1.7 | 0.33 |
| 9 | ASM (10 ml) VAZO-52 (0.14 g) MMu (1.0 g) Toluene (10 ml) | 8.9 | 70.0 | 90:10 | 141 | 65,700 | 37,350 | 1.8 | 0.26 |

EXAMPLE 2

The procedure of Example 1 was employed except that the following amounts of the reaction components were used: ASM (100 ml, 0.7214 mol), toluene (100 ml), MMu (10 g, 0.0588 mol) and VAZO-52 (1.4 g). At the end of 18 hours of run time, an additional 0.5 g of VAZO-52 in 5.0 ml of toluene was added to the reaction mixture to ensure complete polymerization of the starting monomers. The reaction was continued for an additional 4 hours and the polymer was isolated as in Example 1 by dissolving the syrup in 300 ml acetone and coagulating with 13 liters of acidified methanol, filtering and drying to yield 10 g of polymer. The degree of conversion was 83%. The molecular composition of the polymer was found to be ASM:MMu—90:10 molar ratio; wt. % C found—72.21, calc.—72.22; H found—6.355, calc.—6.18. The product was of high purity Examples 10 and 11 illustrate the use of other azo initiators such as VAZO-67 and VAZO-88 to synthesize copolymers of ASM and MMu.

EXAMPLE 10

The procedure of Example 1 was followed except for the following amounts of the reaction components: ASM 10 ml, MMu 2.0 g, VAZO-67 0.28 g, and toluene 10 ml. The reaction was carried out at 80° to 90° C. for 20 hours. The yield of the purified and dried polymer was 10.3 g, degree of conversion 75%. The molecular composition was found to be ASM:MMu - 80 : 20 molar ratio; elemental analysis in wt. % - C found 70.635, calc. 70.4; H found 6.38, calc. 6.155. The glass transition $(T_g)$ temperature of the product was 112.5° C. with decomposition onset at 280° C.

EXAMPLE 11

The procedure of Example 1 was followed except for the following amounts of the reaction components: ASM 10 ml, MMu 2.0 g, VAZO-88 0.28 g, and toluene 10 ml. The reaction was carried out at 90° to 100° C. for 20 hours. The yield of the purified and dried polymer was 10.2 g, degree of conversion 75%. The molecular composition was found to be ASM:MMu - 80 : 20 molar ratio; elemental analysis in wt. % - C found 70.61, calc. 70.4; H found 6.2, calc. 6.155. The glass transition ($T_g$) temperature of the product was 112.5° C. with decomposition onset at 280° C.

Examples 12 to 14 illustrate copolymers of diethyl muconate (EMu) and ASM,.

EXAMPLE 12

The procedure of Example 1 was followed except for the following amounts of the reaction components: ASM 30 ml, EMu 3.0 g, VAZO-52 0.42 g, and toluene 30 ml. The reaction was carried out at 70° C. for 16 hours. The yield of the purified and dried polymer was 28 g, degree of conversion 70%. The molecular composition was found to be ASM:EMu - 90:10 molar ratio; elemental analysis in wt. % - C found 72.6, calc. 72.5; H found 6.65, calc. 6.32. The weight average molecular weight ($M_w$), the number average molecular weight ($M_n$), and the polydispersity ($M_w/M_n$) were determined to be 40,900, 25,500, and 1.5 respectively. The intrinisic viscosity of the polymer was 0.23.

EXAMPLE 13

The procedure of Example 1 was followed except for the following amounts of the reaction components: ASM 10 ml, EMu 1.0 g, VAZO-52 0.14 g, and toluene 10 ml. The reaction was carried out at 80° C. for 16 hours. The yield of the purified and dried polymer was 8.6 g, degree of conversion 70%. The molecular composition was found to be ASM:EMu - 90:10 molar ratio; elemental analysis in wt. % - C found 72.1, calc. 72.5; H found 6.3, calc. 6.32.

EXAMPLE 14

The procedure as outlined in Example 1 was followed except for the following amounts of the reaction components: ASM 24.3 g, EMu 3.0 g, VAZO-52 0.28 g, and toluene 20 ml. The reaction was carried out at 70° C. for 16 hours. The yield of the purified and dried polymer was 22.3 g, degree of conversion 82%. The molecular composition was found to be ASM:EMu - 85:15 molar ratio; elemental analysis in wt. % - C found 71.525, calc. 71.67; H found 6.56, calc. 6.38.

Example 15 illustrates a terpolymer of ASM, MMu, and styrene under the invention.

EXAMPLE 15

The procedure as described in Example 1 was followed except for the following amounts of the reaction components: ASM 20 ml, MMu 6.0 g, styrene 10 ml, VAZO-52 0.42 g, and toluene 30 ml. The reaction was carried out at 70° C. for 16 hours. The yield of the terpolymer was 23.1 g, degree of conversion 60%. The glass transition temperature ($T_g$) of the terpolymer was 91.5° C. with decomposition onset at 320° C.

Examples 16 and 17 illustrate copolymers of diallyl maleate (DAM) and ASM.

EXAMPLE 16

The procedure of Example 1 was followed except for the following amounts of the reaction components: ASM 10 ml, DAM 2.0 g, VAZO-52 0.14 g, and toluene 10 ml. The reaction was carried out at 70° C. for 16 hours. The yield of the purified and dried polymer was 9.7 g, degree of conversion 71%. The $^1$H NMR of the copolymer revealed that the allylic groups were intact and did not participate in the polymerization. Based on the allylic and aromatic absorption intensities, and by elemental analysis, the composition of the copolymer was determined to be ASM:DAM - 90:10 molar ratio; elemental analysis in wt. % - C found 72.69, calc. 72.53; H found 6.08, calc. 6.21. The infrared spectrum showed a broad carbonyl absorption between 1770 to 1740 cm$^{-1}$ corresponding to the acetoxy and diallyl maleate carbonyls of the repeat units. The glass transition ($T_g$) temperature of the polymer was 110° C. for the first heating as determined by DSC. The thermogram also showed an exotherm right after the $T_g$, probably indicating some cross linking through the allylic double bonds. The second and third heatings of the copolymer showed glass transitions at 120° and 121° C. respectively. The weight average molecular weight ($M_w$), the number average molecular weight ($M_n$), and the polydispersity ($M_w/M_n$) were determined to be 124,150, 54,750, and 2.27 respectively.

EXAMPLE 17

The procedure of Example 1 was followed except for the following amounts of the reaction components: ASM 10 ml, DAM 4.0 g, VAZO-88 0.14 g, and toluene 10 ml. The reaction was carried out at 70° C. for 16 hours. The reaction mixture did not become very viscous indicating that the degree of polymerization was very low. Another batch of 0.14 g of VAZO-88 in 2 ml of toluene was therefore added to the reaction on mixture and the termperature of the reaction was increased to 80° C. After 6 hours, the reaction mixture had turned very viscous, the reaction was arrested at this time and the product isolated in the usual manner. The yield of the purified and dried polymer was 6 g, degree of conversion 38%. The $^1$H NMR of the copolymer revealed that the allylic groups were intact and did not participate in the polymerization. Based on the allylic and aromatic absorption intensities, and by elemental analysis, the composition of the copolymer was determined to be ASM:DAM 80:20 molar ratio; elemental analysis in wt. % - C found 68.95, calc. 71.08; H found 5.67, calc. 6.2. The infrared spectrum showed a broad carbonyl absorption between 1770 to 1740 cm$^{-1}$ corresponding to the acetoxy and diallyl maleate carbonyls of the repeat units. The glass transition ($T_g$) temperature of the polymer was 90° C. for the first heating, and increased to 121.6 and 123° C. during the second and third heating respectively. This indicates again cross linking taking place during the first heating. The weight average molecular weight ($M_w$), the number average molecular weight ($M_n$), and the polydispersity ($M_w/M_n$), were determined to be 352,000, 133,900, and 2.63 respectively.

Example 18 illustrates a copolymer of ASM and methyl sorbate (MS) under the invention.

EXAMPLE 18

The procedure of Example 1 was followed except for the following amounts of the reaction components:

ASM 10 ml, MS 2 g, VAZO-88 0.14 g, and toluene 10 ml. The reaction was carried out at 70° C. for 16 hours, but the reaction mixture was not very viscous. An additional 0.14 g of VAZO-88 in 2 ml of toluene was added to the reaction mixture and the temperature was increased to 80° C. After 3 hours, the reaction was stopped and the product isolated in the usual manner. The yield of the purified molecular composition was found to be ASM:MS - 80:20; elemental analysis in wt. % - C found 72.6, calc. 72.85; H found 6.5, calc. 6.32. The infrared spectrum showed carbonyl absorptions at 1765 and 1735 cm$^{-1}$ corresponding to the acetoxy and sorbate carbonyls of the polymer repeat units. The weight average molecular weight ($M_w$), the number average molecular weight ($M_n$), and the polydispersity ($M_w/M_n$) were determined to be 88150, 50300, and 1.76 respectively. The glass transition temperature ($T_g$) of the polymer was determined to be 106° C. during first heating which increased to 112 and 112.3° C. in the second and third heatings of the sample. The polymer also showed an exotherm immediately after the $T_g$ indicating that crosslinking is taking place in all these runs, but the magnitude of the exotherm diminished significantly after the first heating.

Example 19 illustrates a copolymer of ASM and 2,5-dimethyl-2,4-hexadiene (DHD) under the invention.

EXAMPLE 19

The procedure of Example 1 was followed except for the following amounts of the reaction components: ASM 10 ml, DHD 2.2 g, VAZO-88 0.28 g, and toluene 10 ml. The reaction was carried out at 80° C. for 16 hours. The yield of the purified and dried polymer was 5.8 g, degree of conversion 42%. The infrared spectrum showed a sharp single carbonyl absorption at 1765 cm$^{-1}$ corresponding to the acetoxy group on the phenyl ring of the polymer repeat unit. The glass transition temperature ($T_g$) of the polymer was found to be 130° C. during the first heating which decreased to 127.5° C. in the second and third heatings of the sample. The polymer also showed an exotherm immediately after the $T_g$ indicating that crosslinking is taking place in all these runs, but the magnitude of the exotherm diminished significantly after the first heating.

I claim:

1. A copolymer of monomers comprising p-acetoxystyrene and a polyunsaturated comonomer consisting of an alkyl ester of a carboxylic acid containing a conjugated diene group, an allyl ester of a monoethylenically unsaturated carboxylic acid, 2,5-dimethyl-2,4-hexadiene, 2,4-hexadiene, or 2-chloro-2,4-hexadiene.

2. The copolymer of claim 1 wherein said monomers comprise about 10 to 90 weight percent of p-acetoxystyrene and 90 to 10 weight percent of said polyunsaturated comonomer.

3. A copolymer of monomers comprising p-acetoxystyrene and an alkyl ester of a carboxylic acid containing a conjugated diene group, said alkyl groups containing 1 to 4 carbon atoms.

4. The copolymer of claim 3 wherein said alkyl ester is a dialkyl muconate.

5. The copolymer of claim 4 wherein said dialkyl muconate is dimethyl muconate.

6. The copolymer of claim 4 wherein said dialkyl muconate is diethyl muconate.

7. The copolymer of claim 3 wherein said alkyl ester is an alkyl sorbate.

8. The copolymer of claim 7 wherein said alkyl sorbate is methyl sorbate.

9. A copolymer of monomers comprising p-acetoxystyrene and an allyl ester of a monoethylenically unsaturated carboxylic acid.

10. The copolymer of claim 9 wherein said allyl ester is diallyl maleate.

11. The copolymer of claim 1 wherein said polyunsaturated comonomer is 2,5-dimethyl-2,4-hexadiene.

12. The copolymer of claim 1 wherein said monomers comprise at least one additional monoethylenically unsaturated monomer.

13. The copolymer of claim 12 wherein said additional monomer is styrene.

14. The copolymer of claim 13 wherein said monomers comprise p-acetoxystyrene, a dialkyl muconate in which the alkyl groups contain 1 to 4 carbon atoms, and styrene.

15. The copolymer of claim 14 wherein said dialkyl muconate is dimethyl muconate.

16. The copolymer of claim 14 wherein said dialkyl muconate is diethyl muconate.

* * * * *